United States Patent [19]
Temple et al.

[11] Patent Number: 5,424,563
[45] Date of Patent: Jun. 13, 1995

[54] APPARATUS AND METHOD FOR INCREASING BREAKDOWN VOLTAGE RUGGEDNESS IN SEMICONDUCTOR DEVICES

[75] Inventors: Victor A. K. Temple, Clifton; Stephen D. Arthur, Scotia; Donald L. Watrous, Clifton Park, all of N.Y.; John M. S. Neilson, Norristown, Pa.

[73] Assignee: Harris Corporation, Melbourne, Fla.

[21] Appl. No.: 173,077

[22] Filed: Dec. 27, 1993

[51] Int. Cl.⁶ ............................................. H01L 29/74
[52] U.S. Cl. .................................. 257/154; 257/175; 257/169
[58] Field of Search ................ 257/174, 175, 129, 154, 257/539, 149, 169

[56] References Cited

FOREIGN PATENT DOCUMENTS

| | | | |
|---|---|---|---|
| 53137835 | 5/1980 | Japan | 257/175 |
| 57-169270 | 10/1982 | Japan | 257/175 |
| 58-57748 | 4/1983 | Japan | 257/175 |
| 1073560 | 6/1969 | United Kingdom | 257/129 |

OTHER PUBLICATIONS

Duclos et al. "Thyristors with Polysilicon Shunt Resistors" RCA Technical Notes TN 1365 Mar. 21, 1985.
Stasior, Richard A. Stasior, "How to Suppress Rate Effect In PNPN Devices" Electronics Jun. 1964.

Primary Examiner—Mark V. Prenty
Assistant Examiner—Donald L. Monin, Jr.
Attorney, Agent, or Firm—Rogers & Killeen

[57] ABSTRACT

The sensitivity of breakdown voltage to temperature and dV/dT induced currents is reduced in semiconductor power devices having a wide base transistor. The sensitivity is reduced by diverting current from the emitter of the wide base transistor to the base of the wide base transistor (an emitter short that does not reduce breakdown voltage) or by injecting a current into the base of the wide base transistor to its collector (an injected current that may lower the breakdown voltage, but no more than that related to temperature and capacitive current). The invention finds application in both epitaxial grown and substrate based devices.

35 Claims, 7 Drawing Sheets

P-MCT

P-IGBT

P-MCT $$i_1 \approx \frac{BV_{CEO} - N \cdot V_E}{R_S}$$

APPARATUS AND METHOD FOR INCREASING BREAKDOWN VOLTAGE RUGGEDNESS IN SEMICONDUCTOR DEVICES

BACKGROUND OF THE INVENTION

The present invention relates to semiconductor power devices that have a wide base transistor therein, and more particularly to an apparatus and method for reducing breakdown voltage sensitivity to temperature and rate of change of voltage (dV/dT) in a semiconductor power device that has a wide base transistor by increasing the current through the base relative to the current through the emitter, either by diverting current from the emitter to the base or by injecting current from the collector into the base.

Various types of semiconductor power devices include a wide base transistor, such as the MOS controlled thyristor (MCT) 10 illustrated in FIG. 1 and the insulated gate bipolar transistor (IGBT) 20 illustrated in FIG. 2 (gate turn-on devices and silicon controlled rectifiers are further examples). In such devices, the transistor 12, 22 has a wide voltage carrying layer (the wide base 14, 24). Four layer devices, such as the MCT 10, may also include an upper transistor 16 having layers common to those of the lower, wide base transistor 12 (e.g., the wide base 14 is also the collector of the upper transistor 16). A buffer layer 15 may be placed between the lower emitter-base junction J1 and the wide base layer 14 to improve lateral conductivity of leakage currents away from the middle of the device. A circuit diagram equivalent to the P-MCT illustrated in FIG. 1 (an MCT with a P-type wide base) is shown in FIG. 3.

The operation of semiconductor power devices is discussed in *Semiconductor Power Devices* by S. K. Ghandi, John Wiley & Sons, 1977. Briefly, and with further reference to FIGS. 1 and 3, an MCT is turned on by the on-FET when a small voltage of one polarity (e.g., −5 volts) is applied to the gate 18. The voltage starts a regenerative action that turns on both the upper and wide base transistors 12, 16 so that the MCT conducts. The MCT is turned off by the off-FET when a small voltage of the opposite polarity (e.g., +7 volts) is applied to the gate. When the MCT is being turned off, the gate voltage creates an electric field in the channel region 19 beneath the gate; that is, the electric charge on the gate 18 causes the semiconductor type of the channel region 19 beneath the gate to convert to the opposite semiconductor type, effectively shorting the emitter-base junction of the upper transistor 16. The channel is a conductive path around the emitter that turns off the upper transistor 16 and stops MCT conduction (the device is in a blocking condition). When the MCT is in the blocking condition the wide base transistor 14 is not being shorted like the upper transistor and is essentially free to operate if a current, such as a leakage current, is applied thereto.

One of the problems associated with the wide base transistors, more so with NPN transistors than PNP transistors, is that they appear to be very fragile when the device is operated at high voltages with low current levels. Specifically, the operation of the transistor with an inductive load may be accompanied by voltage excursions beyond $BV_{CEO}$. With reference to FIG. 4 that illustrates the common emitter characteristics of a semiconductor power device, it may be seen that at extremely low current levels, the breakdown voltage rises to its upper limit of $BV_{CBO}$. Once this voltage is exceeded, the current through the device increases, accompanied by an increase in current gain. As a result, the device voltage "snaps back" as illustrated by line portion AB. Operation under these conditions leads to device failure caused by lateral electrical instability.

The extremely low current levels that may cause such failure are associated with temperature induced leakage currents and/or dV/dT induced leakage currents that may be found in semiconductor power devices.

The inventors have determined that these induced leakage currents are the reason why semiconductor power devices do not achieve their experimentally determined breakdown voltage under actual operating conditions. For example, a P-MCT with an experimentally determined breakdown voltage of 1460 volts may have an actual breakdown voltage of only about 900 volts. With reference now to FIG. 5 (experimental results for a P-MCT under varying temperature and dV/dT conditions), it may be seen that as the temperature of the device increases, the breakdown voltage of the device decreases. Similarly as dV/dT increases at low temperature, the breakdown voltage decreases.

By way of explanation, and using the P-MCT as an example, when the P-MCT is in the blocking condition the electric charge on the gate forms an inversion channel 19 that shunts current flowing through the upper transistor 16, bypassing the upper emitter-base junction and preventing the device from latching on. The small cell sizes employed in the fabrication of MCTs ensure that the upper transistor 16 is well shorted even under large dV/dT conditions.

In contrast, the wide base transistor 12 of the P-MCT is not shorted, is in an open base state when in the blocking condition, and may have an open base current therein. If it is assumed that the upper transistor of the MCT is completely shunted by the off-FET and does not contribute any back injection, then the open base current equation for the wide base transistor is:

$$I_{ak} = \left[ \frac{M}{(1 - \alpha_o * M)} * I_{co} \right] + \left[ \frac{M}{(1 - \alpha_o * M)} * \frac{CdV}{dT} \right] \quad (1)$$

where M is the multiplication factor, $\alpha_O$ is the current gain, $I_{CO}$ is the open emitter leakage current, and C dV/dT is the capacitive current component.

Breakdown takes place when $I_{ak}$ gets very large with small increases in voltage. This occurs in the open base situation when the effective multiplication defined below gets large.

$$\text{Effective Multiplication} = \frac{M}{(1 - \alpha_o * M)} \quad (2)$$

The variable M is a function of the doping profile, the applied voltage, and the carrier type initiating the ionization and may be calculated for a specific voltage using known techniques. The current gain, $\alpha_O$, is a function of the wide base transistor 12 doping profile, base/collector voltage, transistor type, temperature, and the current level in the wide base transistor 12.

The dependence on current level can be significant. If current gain, $\alpha_O$, is strongly dependent on current level at low current levels, as it is in the wide base NPN transistors of semiconductor power devices, then the $\alpha_O * M$ product will change as the current level through the device changes. When the change causes the product to approach the value one, the effective multiplication can become very large, causing current gain, $I_{ak}$, to increase, causing breakdown to occur.

As is known, the current level is affected by temperature and dV/dT. Increasing the temperature of a device increases the leakage current through it, and increasing dV/dT in the device increases the capacitive current therein. Thus, increases in temperature and dV/dT cause the current level in the device to increase, thereby decreasing the breakdown voltage of the device.

One of the operational problems that this dependence on temperature and dV/dT creates is that the breakdown voltage of the semiconductor power device is neither stable nor predictable. Users of such devices need to know the breakdown voltage of their devices with some certainty so that systems can be designed to achieve specific results. Another operational problem caused by this dependence is that changing breakdown voltage also causes the avalanche current capability of the device to become unstable and unpredictable.

Thus, the user of the device in an environment with changing temperature and dV/dT is faced with not only an unpredictable breakdown voltage, but also with a device having an unpredictably reduced capability. The term "ruggedness" is used herein to refer to the ability of a semiconductor power device to withstand temperature and dV/dT changes without inviting these problems.

Accordingly, it is an object of the present invention to provide a novel method and system for improving the ruggedness of a semiconductor power device.

It is a further object of the present invention to provide a novel apparatus and method in which ruggedness is improved by increasing the current through the wide base relative to the current through the emitter.

It is yet a further object of the present invention to provide a novel apparatus and method in which ruggedness is improved by diverting current from the emitter of the wide base transistor to the base.

It is still a further object of the present invention to provide a novel apparatus and method in which ruggedness is improved by injecting a current into the wide base at least as large as the current associated with temperature and dV/dT effects.

It is another object of the present invention to provide a novel apparatus and method in which a resistive current path connects the base of the wide base transistor of a semiconductor power device to the power terminal which forms the collector of the transistor.

It is still another object of the present invention to provide a novel system and method for improving the ruggedness of semiconductor power devices in which a grid of low resistivity semiconductor material is added to a buffer layer to improve lateral conductivity.

It is yet another object of the present invention to provide a novel system and method in which an external resistive path is provided for injecting a current into the base of a wide base transistor to reduce the dependence on temperature and dV/dT in a semiconductor power device.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

In the present invention, breakdown voltage sensitivity to temperature and rate of change of voltage (dV/dT) in a wide base transistor is decreased by increasing the current through the base relative to the current through the emitter by using a resistive current path to (a) divert current from the emitter to the base (an emitter short) or (b) inject current from the collector of the wide base transistor into the base (a feedback mechanism). By so doing, the breakdown voltage is stabilized at a predictable level (a lower level in the feedback mechanism than in the emitter short) that is not substantially affected by temperature and/or dV/dT. In effect, the present invention biases the transistor to a value of base current that is beyond the current gain attributable to temperature and/or dV/dT. By way of example, an acceptable level of base current may be about 1 mA for an N-MCT device and about 2 to 3 mA for a P-MCT. At this level the device's negative resistance is significantly reduced so that the device is more rugged. The emitter-base junction potential is desirably less than that required for any appreciable injection (i.e., a fraction of a diode drop).

The location of the resistive current path and the magnitude of the resistance in the path are to be determined based on the specific semiconductor power device. As will be discussed in more detail below, the location of the path is determined, at least in part, by the method of manufacturing the semiconductor power device (i.e., epitaxially grown or substrate based). It is preferable that the resistance in the current path be rather large, in the megohm range, as it presents an unwanted loss term.

Figure 6:
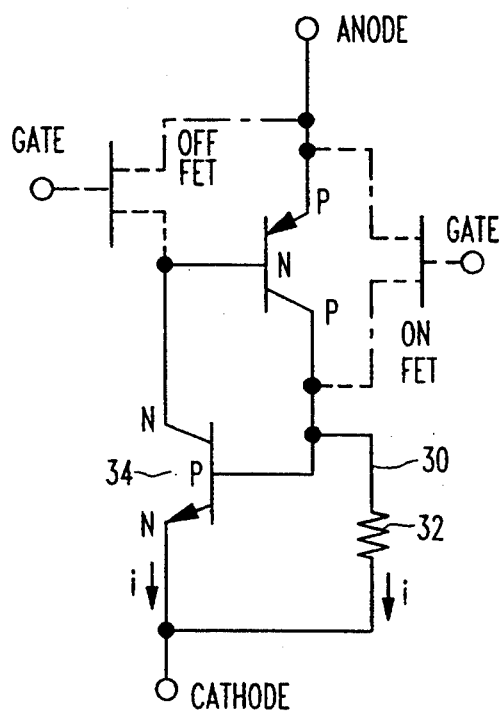
FIG. 6 is a circuit diagram of a P-MCT incorporating an embodiment of the present invention (the emitter short).

The Emitter Short. With reference now to FIG. 6, the embodiment of the present invention incorporating an emitter short may be seen in a P-MCT circuit. A current path 30 with resistor 32 provides a shunt between the base and the emitter of the wide base transistor 34 that shorts, or partially shorts, the emitter junction without appreciably affecting forward drop or device complexity, and, perhaps more significantly, without appreciably changing the breakdown voltage. When device current levels reach the point where the shunt is no longer effective, the transistor gain is reasonably stable and the breakdown of the wide base transistor is not subject to "snap back" to the $BV_{CEO}$ value. The resistive path reduces the effective gain of the wide base transistor 34 for the small current levels induced by high temperature and/or dV/dT.

Figure 1:
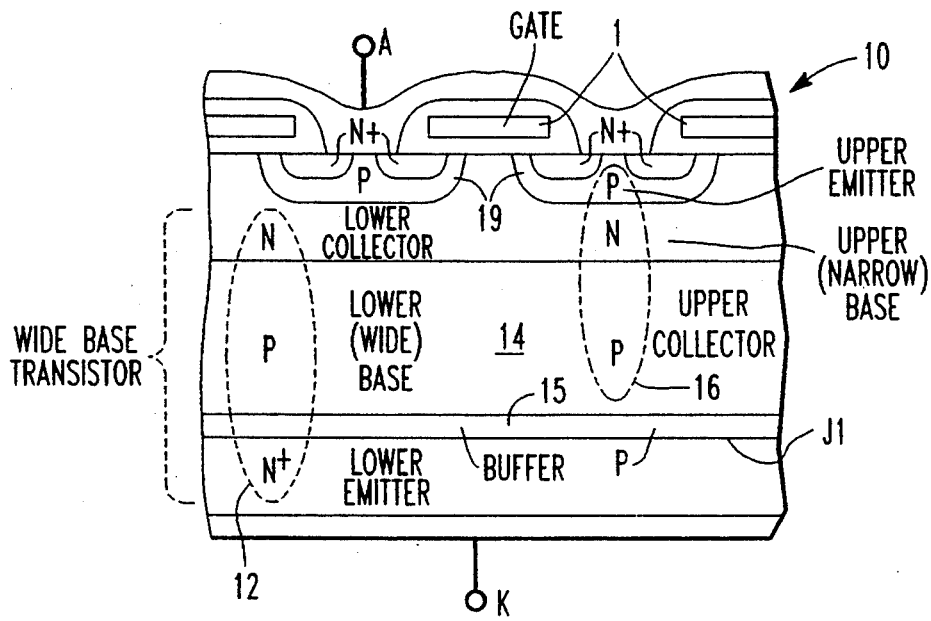
FIG. 1 is a partial vertical cross-section illustrating the interior of a P-type MOS controlled thyristor (P-MCT) of the prior art.
Figure 2:
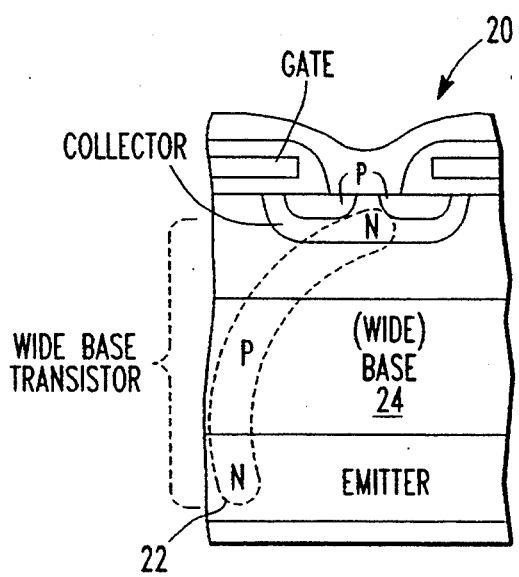
FIG. 2 is a partial vertical cross-section illustrating the interior of a P-type insulated gate bipolar transistor (P-IGBT) of the prior art.
Figure 3:
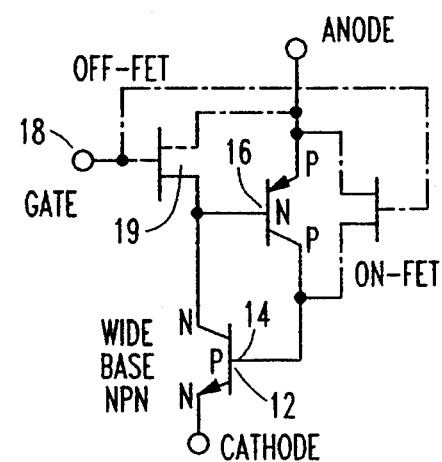
FIG. 3 is a circuit diagram of the P-MCT of FIG. 1.
Figure 4:
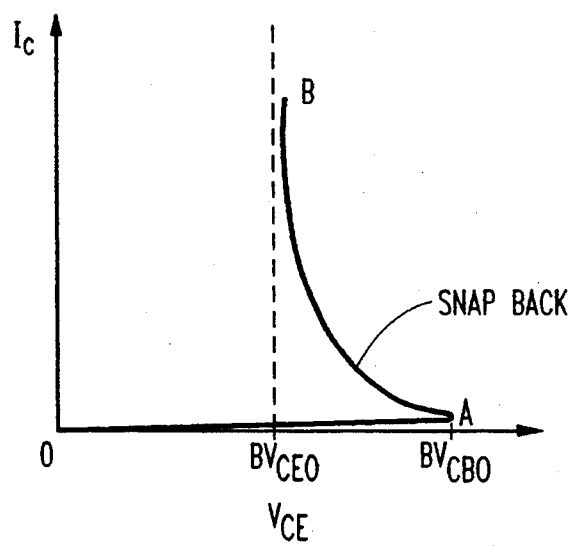
FIG. 4 is graphical depiction of "snap back" in wide base transistors of semiconductor power device.
Figure 5:
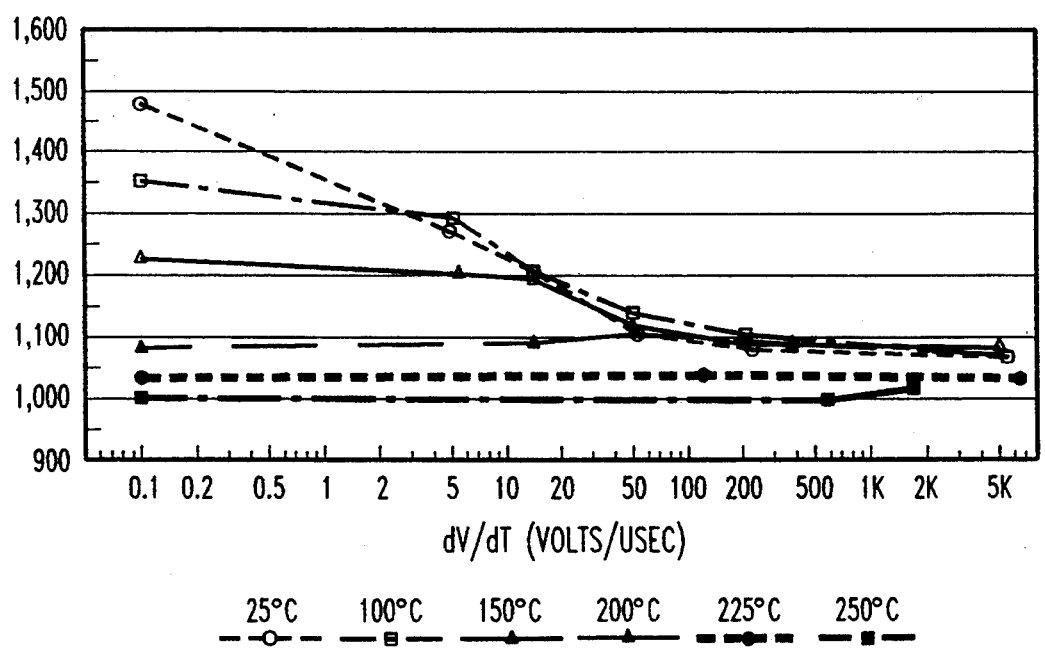
FIG. 5 is a chart illustrating the dependence of P-MCT breakdown voltage on temperature and dV/dT.
Figure 7:
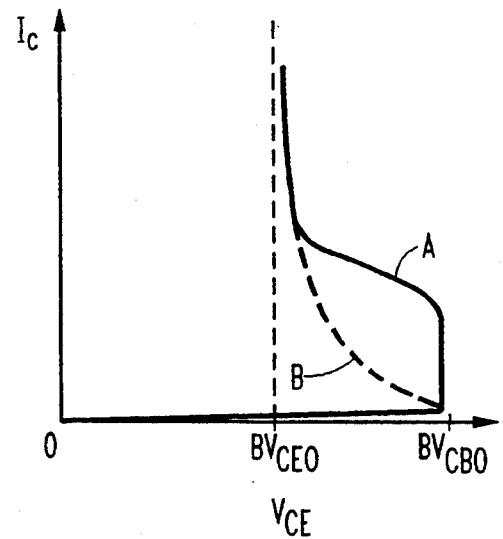
FIG. 7 is a graphical depiction of the improved device common emitter characteristics (solid line A) afforded by the embodiment of FIG. 6.

The result of the addition of the resistive current path is illustrated in FIG. 7 in which the common emitter characteristics of the device with the invention are shown in the solid line A and the characteristics without the invention (FIG. 4) are shown in the dashed line B.

Figure 8:
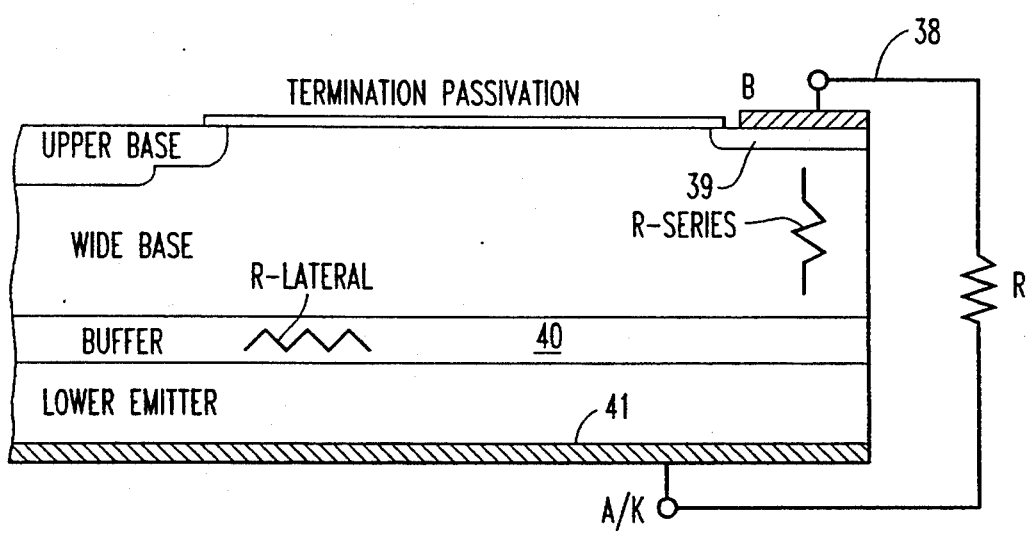
FIG. 8 is a pictorial representation of a vertical cross-section of an epitaxially grown semiconductor power device illustrating an embodiment of the resistive current path of the present invention.

When the semiconductor power device is manufactured using an epitaxial process, such as illustrated in FIG. 8, the base of the wide base transistor can be contacted through a terminal B on the upper surface of the device. The resistive current path may be wired to the anode or cathode directly, such as through a circuit 38 or through an externally controlled switching circuit (not shown). The circuit 38 is desirably direct wire-bonded between a field stop 39 and the backmetal 41 of the device. The total resistance in the resistive current path may be considered to include the lateral sheet resistance in the buffer layer 40 (R-lateral), the effective series resistance between the buffer layer 40 and the terminal B (R-series), and the resistance R in the external portion of the resistive current path.

Figure 9:
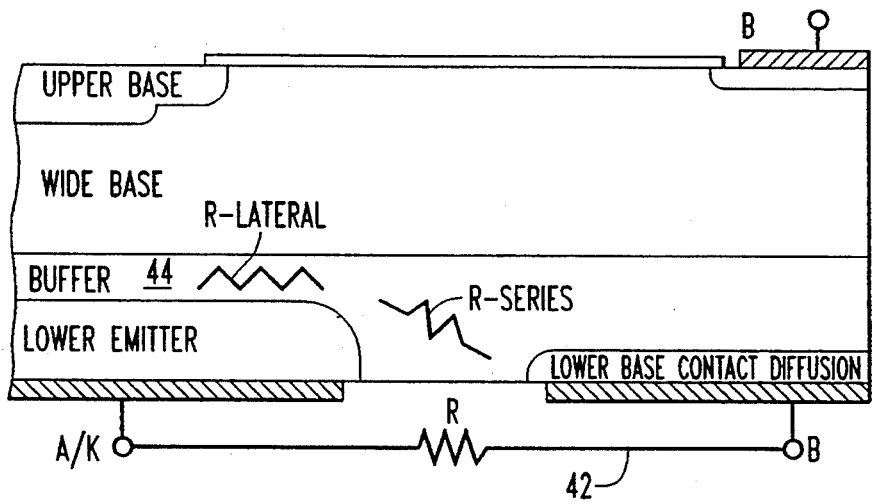
FIG. 9 is a pictorial representation of a vertical cross-section of a substrate based semiconductor power device illustrating a further embodiment of the resistive current path of the present invention.

In semiconductor power devices manufactured using diffusion and/or implant techniques (such as illustrated in FIG. 9), a wide base contact area may be provided so that the direct connection between the wide base contact B and the anode or cathode may be on the same surface of the semiconductor device. Again, the resistance in the resistive current path 42 may be considered to include the lateral sheet resistance in the buffer layer 44, the effective series resistance and the external resistance R in the conductive path 42.

Figure 10:
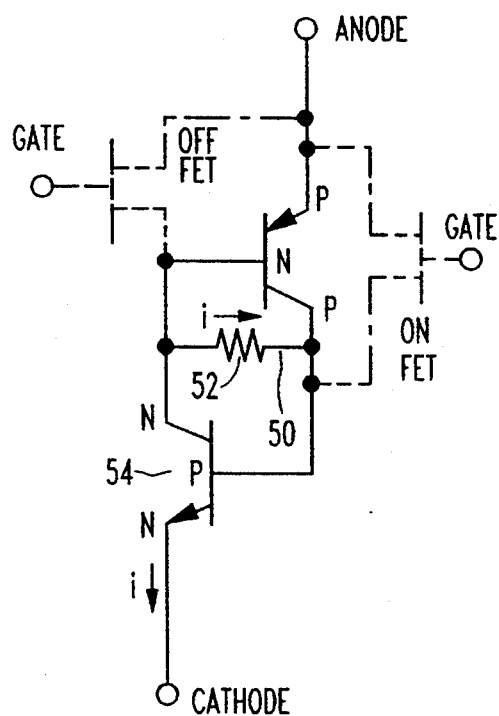
FIG. 10 is a circuit diagram of a P-MCT incorporating a further embodiment of the present invention (the feedback mechanism).

Feedback Mechanism. With reference now to FIG. 10, the embodiment of the present invention that incorporates a feedback mechanism may be seen in a P-MCT circuit. A current path 50 with a resistor 52 connects the base of the wide base transistor 54 to its collector to inject a current into the base.

Figure 11:
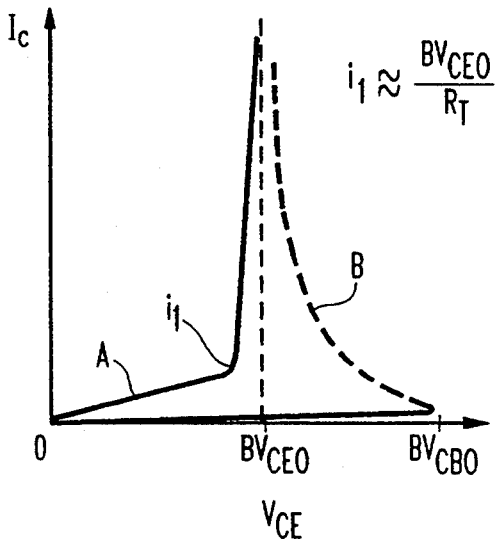
FIG. 11 is a graphical depiction of the improved device common emitter characteristics (solid line A) afforded by the embodiment of FIG. 10.

The result of the addition of the resistive current path is illustrated in FIG. 11 in which the common emitter characteristics of the device with the invention are shown in the solid line A and the characteristics without the invention (FIG. 4) are shown in the dashed line B, and where the current at $i_1 \approx BV_{CEO}/R_T$, $R_T$ being the total resistance in the resistive current path. By way of example, it has been found that the feedback mechanism of the present invention may increase the safe breakdown voltage current level of a P-MCT from about 10 $\mu$A (at 25° C.) to more than 6 mA, while reducing the breakdown voltage from 1150 volts to 963 volts where $R_T$ is about 1 megohm.

Since the resistive path must support the full rated blocking voltage of the device, the resistive path is preferably located in the termination area of the device with one end of the resistive path contacting the field stop diffusion region. It also must be recognized that the placement of a resistor above the high voltage termination region can adversely affect breakdown voltage. To prevent this, the resistor may be graded to mirror the subsurface voltage distribution near the breakdown voltage. It is also recognized that the resistive current path can be useful in some cases to increase breakdown voltage by offering another means to control lateral voltage and fields in the termination region.

Figure 12:
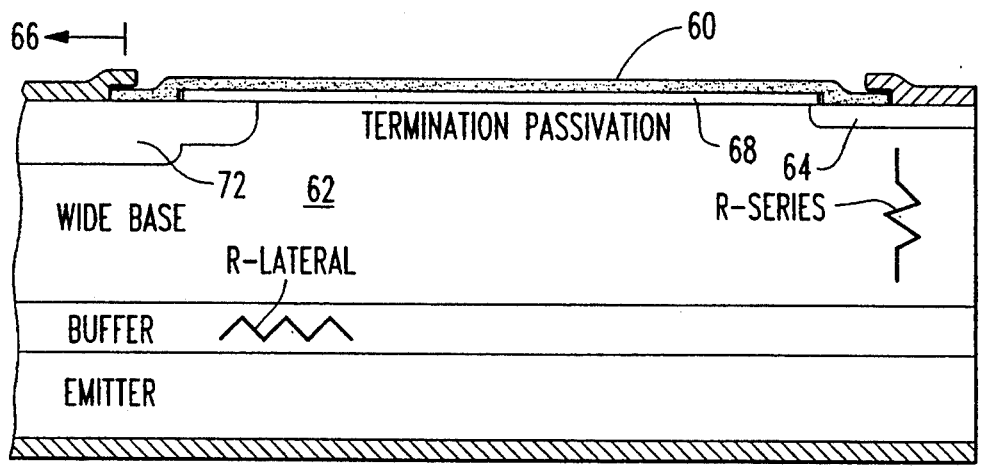
FIG. 12 is a pictorial representation of a vertical cross-section of a semiconductor power device illustrating an embodiment of the feedback mechanism of FIG. 10.

With reference now to FIG. 12, the resistive current path of the present invention may be a resistive layer 60 that biases the wide base 62 when placed between a field stop 64 and the collector 72 in the cellular active region 66 of the device. The resistive layer 60 may be a material that can be doped to different resistivities, such as SIPOS or other doped polyresistor and may be placed on top of a passivation layer 68. The resistive layer 60 may be doped to a suitable level that, when combined with its geometry, would give a resistance that at full blocking voltage would supply a current of anywhere in the range of tens of microamps to tens of miliamps depending on the desired degree of ruggedness of the device. The resistive layer 60 may be used in epitaxially manufactured devices, such as shown in FIG. 12, or in substrate based devices (not shown). Further, in MCT's and IGBT's where a lightly doped polysilicon is used for the gate layer, it is advantageous to use the lightly doped polysilicon to serve in the resistive layer 60 to save manufacturing steps.

Figure 13:
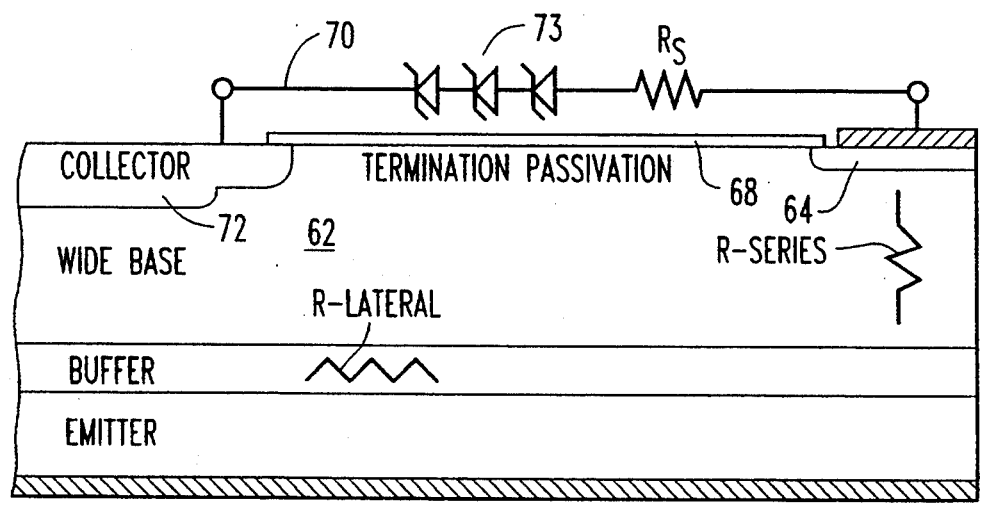
FIG. 13 is a pictorial representation of a vertical cross-section of a semiconductor power device illustrating a further embodiment of the feedback mechanism of FIG. 10.
Figure 14:
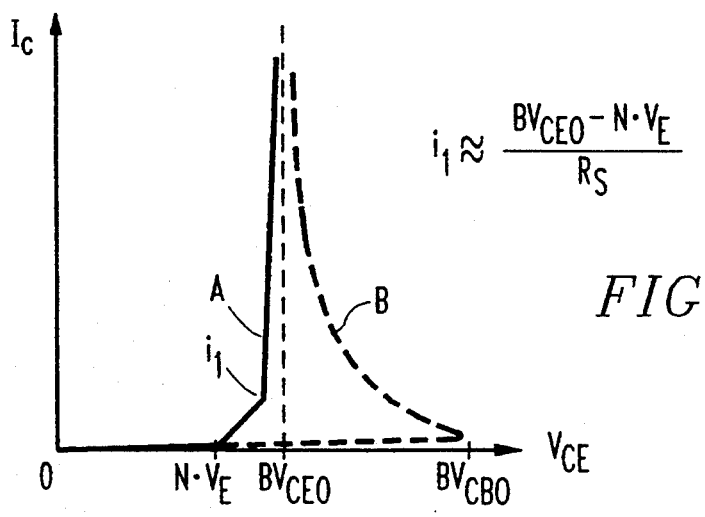
FIG. 14 is a graphical depiction of the improved device common emitter characteristics (solid line A) afforded by the embodiment of FIG. 13.

As illustrated in FIG. 13, the feedback mechanism may also be implemented using external components, such as an external current path 70 between the field stop 64 (connected to the wide base 62) and the collector 72 of the wide base transistor. The path 70 may include a simple resistor (such as illustrated in FIG. 9) or may include a resistor $R_S$ and a string of N thin film zener diodes 73 to avoid power loss at voltages less than $BV_{CEO}$. The common emitter characteristics of a device incorporating this embodiment may seen in FIG. 14. The current $i_1$ at approximately the $BV_{CEO}$ may be adjusted by changing the number N of zener diodes 73 capable of blocking $V_Z$ volts, with $i_1$ being determined from:

$$i_1 \approx (BV_{CEO} - N \cdot V_Z)/R_S \qquad (3)$$

In alternative embodiments of the feedback mechanism, and with reference to FIGS. 15A–C, 16A–D, the resistive current path may be shaped or formed so that it is graded to match the subsurface voltage distribution in the termination passivation region at the edge of the device. For example, as is known field rings 76 may be imbedded in the passivation region to reduce the voltage gradient at the lateral edges of a semiconductor device. By using a combination of a resistive layer 60 and surface rings 78 disposed generally adjacent the field rings 76, the voltage gradient across the passivation region may be patterned to achieve a desired shape. The surface rings 78 (which may be formed from metal, polysilicon, or similar material) divide the voltage gradient across the passivation region in proportion to the effective resistance between the surface rings 78. Thus, by grading the voltage across the region, the resistive layer 60 may also stabilize the voltage gradient of the field rings 76 which might otherwise be fairly uncertain due to unknown variations in the passivation layer 68 charge.

Figure 15A:
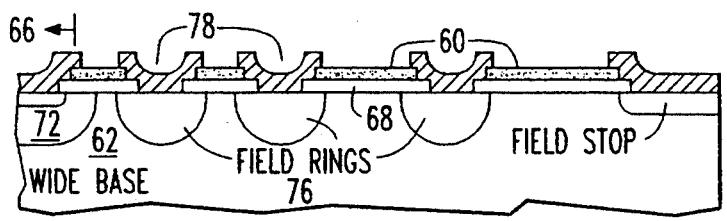
FIGS. 15A-C are pictorial representations of alternative embodiments of the resistive layer in partial vertical cross section (FIG. 15A) and top plan view (two embodiments, FIGS. 15B-C).
Figure 15B:
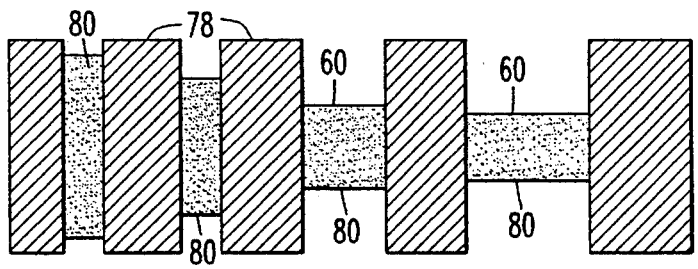
Figure 15C:
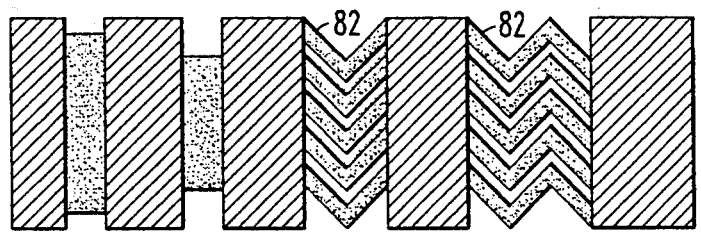

With continued reference to FIGS. 15B–C, the resistive layer 60 need not be continuous but may be shaped to achieve the desired voltage gradient and/or to obtain a desired total resistance between the wide base 62 and the collector 72. For example, with reference to FIG. 15B, the resistive layer 60 may be in the form of plural squares (or rectangles) 80 in annular arrangement about the cellular active region 66. As is known, the resistance of the rectangles are proportional to $$\frac{\text{length}}{\text{width} * \text{thickness}}$$

and thus the width of the rectangles 80 between the surface rings 78 may be adjusted to determine the shape of the charge gradient across the passivation region. Similarly with reference to FIG. 15C, the resistive layer 60 may be shaped to increase the length of the resistive path (for example, in a saw-tooth pattern 82), thereby increasing the total resistance of the resistive current path.

Figure 16A:
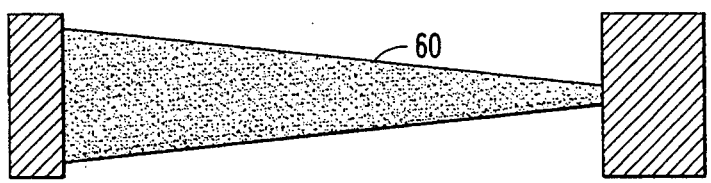
FIGS. 16A-D are pictorial representations of further embodiments of the present invention illustrating geometric patterns of a resistive layer in top plan view (two embodiments, FIGS. 16A-B) and partial vertical cross section (two embodiments, FIGS. 16C-D).
Figure 16B:
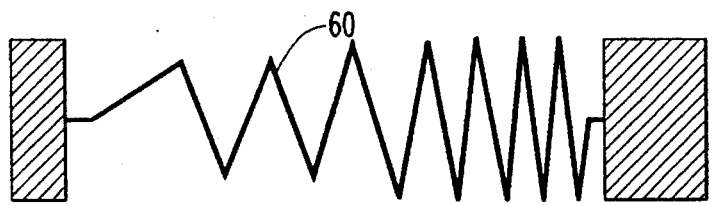
Figure 16C:
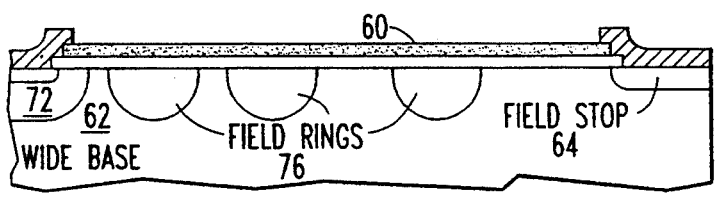
Figure 16D:
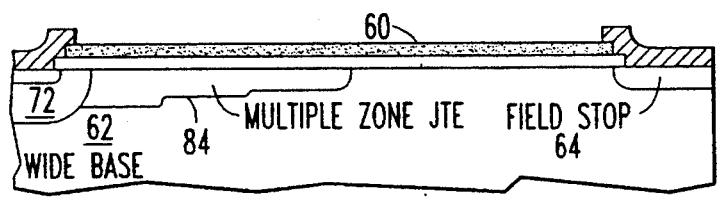

The resistance of the resistive layer 60 in the embodiment of FIG. 12 can be varied by varying the length and/or width and/or geometric pattern of the layer 60, such as illustrated in FIGS. 16A–B. The varying patterns of the layer 60 may be coordinated with field rings as in FIG. 16C, or other lateral/passivation structures, such as a multiple zone junction termination extension (JTE) 84 illustrated in FIG. 16D.

Figure 17A:
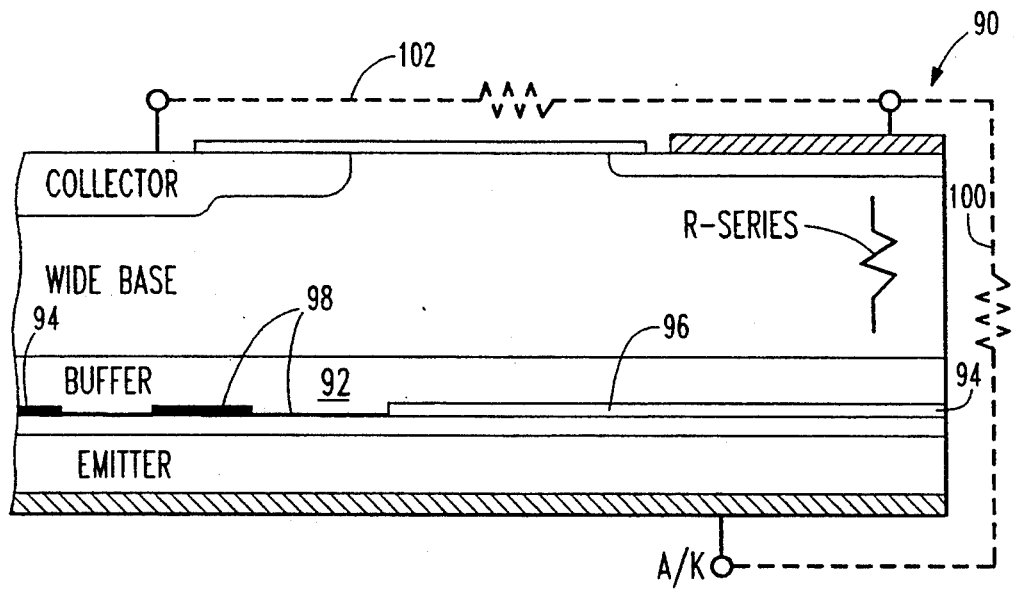
FIGS. 17A-B are pictorial depictions of a resistive reducing grid of an embodiment of the present invention in side view (FIG. 17A) and in top plain view (FIG. 17B).
Figure 17B:
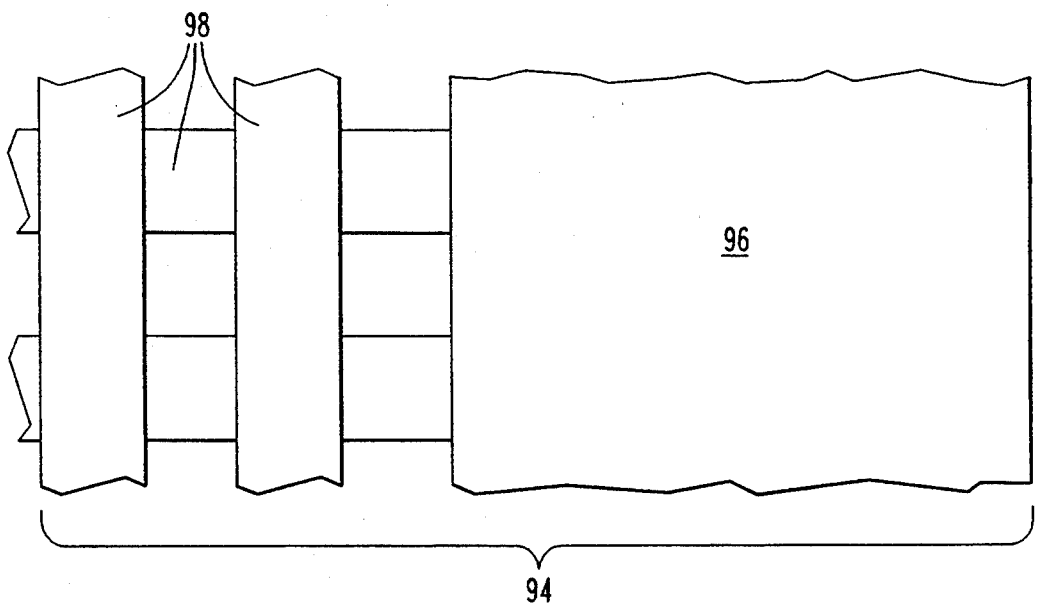

With reference now to FIGS. 17A–B, in an alternative embodiment of the present invention applicable to both the emitter short and feedback mechanism embodiments, further conductive means for carrying current away from the interior portions of the semiconductor power device 90 may be added (one of the emitter short 100 and the feedback mechanism 102 may be used). Use of the further conductive means may be appropriate when the buffer layer 92 of the device is not able to carry away large induced currents from the middle of the device or when the device itself has a large area from which induced currents are to be carried. The conductive means may be a heavily doped P base grid 94 imbedded in or on the buffer layer to carry currents from the center of the device with acceptable resistance. The grid 94 may be patterned into the starting wafer before the epitaxial growth or the epitaxial growth steps may be broken into two to accommodate formation of the grid. The grid may take a variety of patterns, including a cross-hatch pattern, such as illustrated in cross section in FIG. 17A and in plan view in FIG. 17B. The grid 94 may include a solid portion 96 under the termination region of the device, and smaller overlapping portions 98 under the active region of the device. The grid may be accessible from a surface of the device through diffused regions, by Thermal Gradient Zone Melting aluminum, by placement of grooves in the surface or by conduction through the base as illustrated by the R-series in FIG. 17A.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of reducing breakdown voltage dependence on temperature and dV/dT in a semiconductor power device having a wide base transistor therein and wherein breakdown voltage is effected by induced currents related to the temperature or the dV/dT of the device, the method comprising the steps of:
   forming a resistive current path connected to the base of said wide base transistor; and
   providing a current in said resistive current path that exceeds the induced currents related to the temperature or the dV/dT of the device, thereby reducing breakdown voltage dependence on temperature and dV/dT.

2. The method of claim 1 wherein said resistive current path connects the base of said wide base transistor to a collector of the wide base transistor.

3. The method of claim 1 wherein said resistive current path connects the base of said wide base transistor to an emitter of the wide base transistor.

4. The method of claim 1 wherein said resistive current path is, at least in part, external to said semiconductor power device.

5. The method of claim 1 wherein said resistive current path is formed by the step of providing a resistor connecting a field stop at an edge of said semiconductor power device to an emitter of said wide base transistor.

6. The method of claim 1 wherein said resistive current path is formed by the step of providing a resistive element connecting a field stop at an edge of said semiconductor power device to a collector of said wide base transistor.

7. The method of claim 6 wherein said resistive element comprises plural zener diodes.

8. The method of claim 1 further comprising the step of providing a grid of semiconductor material that has a higher impurity concentration than that of said base for improving lateral conduction of the induced currents.

9. The method of claim 1 wherein the semiconductor power device is a MOS controlled thyristor also having a second transistor therein that does not have a resistive current path connected to its base.

10. A method of stabilizing breakdown voltage in a semiconductor power device having a wide base transistor therein comprising the steps of:

forming a current path to a base of the wide base transistor from one of a collector and an emitter of the wide base transistor;

providing a current to said base through said current path, the current in said current path exceeding the current in the transistor related to the temperature and dV/dT of said semiconductor power device when the device is operating.

11. A method of reducing temperature related change in breakdown voltage in a semiconductor power device having a wide base transistor therein comprising the step of providing a current to the base of said wide base transistor that is greater than a leakage current in said wide base transistor related to the temperature of the semiconductor power device.

12. A method of reducing dV/dT related change in breakdown voltage in a semiconductor power device having a wide base transistor therein comprising the step of providing a current to the base of said wide base transistor that is greater than a capacitive current in said wide base transistor related to the dV/dT in the semiconductor power device.

13. A semiconductor power device comprising:
a wide base transistor; and
circuit means for rendering the breakdown voltage of the wide base transistor less sensitive to temperature and dV/dT by establishing a resistive current path between a base of said wide base transistor and one of a collector and an emitter of said wide base transistor, the current path having a resistance so that the current through the current path is greater than those currents induced by temperature and dV/dT when the device is operating.

14. The device of claim 13 wherein said wide base transistor is an NPN transistor.

15. The device of claim 13 wherein said wide base transistor is a PNP transistor.

16. The device of claim 13 wherein said current path is, at least in part, external to said device.

17. The device of claim 16 wherein said current path comprises a resistor and at least one zener diode.

18. The device of claim 13 further comprising a grid of semiconductor material in a buffer layer adjacent an emitter-base junction in said wide base transistor for improving lateral conductivity in said wide base transistor.

19. A semiconductor power device having reduced breakdown voltage dependence on temperature and dV/dT comprising:
an NPN transistor internal to said semiconductor power device;
a resistive current path to the base of said NPN transistor, the resistance in said resistive current path enabling creation of a current in said resistive current path that exceeds a current in said NPN transistor associated with temperature and dV/dT when said semiconductor power device is operating.

20. The device of claim 19 wherein said resistive current path connects the base of said NPN transistor to a collector thereof.

21. The device of claim 19 wherein said resistive current path connects the base of said NPN transistor to an emitter thereof.

22. The device of claim 19 wherein said resistive current path is, at least in part, external to said semiconductor power device.

23. The device of claim 19 wherein said resistive current path comprises a resistive element that connects a high voltage termination area at an edge of said semiconductor power device to an anode or a cathode of said semiconductor power device.

24. The device of claim 23 wherein said resistive element comprises plural zener diodes.

25. The device of claim 19 further comprising a grid of P-type doping in a buffer layer adjacent an emitter-base junction in said NPN transistor that has a resistivity less than the resistivity of said base.

26. A method of reducing breakdown voltage dependence on temperature and dV/dT in a four layer semiconductor device having an upper transistor and a lower wide base transistor therein, the wide base transistor having a buffer layer within its base adjacent the emitter, and wherein breakdown voltage is effected by induced currents related to the temperature or the dV/dT of the device, the method comprising the steps of:
forming a resistive current path connecting the emitter and base of the wide base transistor, the resistance of the resistive current path including lateral sheet resistance in the buffer layer, effective series resistance between the buffer layer and a terminal on a surface of the device, and the resistance in an external portion of the resistive current path that connects the terminal to one of the anode and cathode of the device; and
providing a current in the resistive current path that exceeds the induced currents related to the temperature or the dV/dT of the device, thereby reducing breakdown voltage dependence on temperature and dV/dT.

27. The method of claim 26 wherein the upper transistor does not have a resistive current path connected to its base.

28. The method of claim 26 wherein the terminal and the anode or cathode to which it is connected are on opposing surfaces of the device.

29. The method of claim 26 wherein the terminal and the anode or cathode to which it is connected are on the same surface of the device.

30. A four layer semiconductor device having an upper transistor and a lower wide base transistor therein, the wide base transistor having a buffer layer between its base and emitter, and wherein breakdown voltage is effected by induced currents related to the temperature or the dV/dT of the device, the device comprising:
a resistive current path connecting the collector and base of the wide base transistor, the resistance of said resistive current path including lateral sheet resistance in the buffer layer, effective series resistance between the buffer layer and a terminal at an upper surface of the device, and the resistance in an external portion of said resistive current path that connects the terminal to the collector of the wide base transistor,
a current in said resistive current path exceeding the induced currents related to the temperature or the dV/dT of the device, thereby reducing breakdown voltage dependence on temperature and dV/dT.

31. The device of claim 30 wherein said external portion of said resistive current path includes a resistive layer connecting a field stop at an edge of a termination passivation region of the device, the field stop being connected to the wide base.

32. The device of claim 31 wherein said resistive layer is shaped to generally match a subsurface voltage distribution in the termination passivation region.

33. The device of claim 32 wherein the shape of said resistive layer includes a saw-tooth pattern.

34. The device of claim 32 wherein the shape of said resistive layer includes a pattern in which layer width varies as a function of distance from the field stop.

35. A method of reducing breakdown voltage dependence on temperature and dV/dT in a four layer semiconductor power device having a wide base transistor and a second transistor therein and wherein breakdown voltage is effected by induced currents related to the temperature or the dV/dT of the device, the method comprising the steps of:

forming a resistive current path connected to the base of said wide base transistor, and not to the base of the second transistor; and providing a current in said resistive current path that exceeds the induced currents related to the temperature or the dV/dT of the device, thereby reducing breakdown voltage dependence on temperature and dV/dT.

* * * * *